US012776774B2

(12) United States Patent
Yu et al.

(10) Patent No.: US 12,776,774 B2
(45) Date of Patent: Oct. 27, 2026

(54) BUFFER CIRCUITS AND SEMICONDUCTOR STRUCTURES THEREOF

(71) Applicant: MEDIATEK INC., Hsinchu City (TW)

(72) Inventors: Hao-Hsiang Yu, Hsinchu City (TW); Jen-Hang Yang, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 99 days.

(21) Appl. No.: 19/009,332

(22) Filed: Jan. 3, 2025

(65) Prior Publication Data

US 2025/0141446 A1 May 1, 2025

Related U.S. Application Data

(62) Division of application No. 18/183,359, filed on Mar. 14, 2023, now abandoned.

(Continued)

(51) Int. Cl.
*H03K 17/687* (2006.01)
*H03K 19/01* (2006.01)
(Continued)

(52) U.S. Cl.
CPC ......... *H03K 17/6872* (2013.01); *H03K 19/01* (2013.01); *H03K 19/20* (2013.01); *H10D 84/859* (2025.01)

(58) Field of Classification Search
CPC ...... H03K 17/51; H03K 17/56; H03K 17/687; H03K 17/6871; H03K 17/6872;
(Continued)

(56) References Cited

U.S. PATENT DOCUMENTS 4,604,731 A 8/1986 Konishi
4,779,013 A 10/1988 Tanaka
(Continued)

FOREIGN PATENT DOCUMENTS

EP 3 358 747 A2 8/2018

OTHER PUBLICATIONS

Partial European Search Report dated Aug. 9, 2023, issued in application No. EP 23163228.2.
(Continued)

*Primary Examiner* — Long Nguyen
(74) *Attorney, Agent, or Firm* — McClure, Qualey & Rodack, LLP

(57) ABSTRACT

A buffer circuit is provided to output an output signal at an output node. The buffer circuit includes first and second inverters and first and second switches. The first inverter inverts an input signal. The second inverter is coupled between the first inverter and the output node. The first switch is coupled between a first voltage source terminal and the output node. The second switch is coupled between the output node and a second voltage source terminal. First and second voltages are respectively provided to the first and second voltage source terminals. In response to the input signal switching to a first level from a second level, the first switch is turned on to pre-charge the output node. In response to the input signal transiting to the second level from the first level, the second switch is turned on to pre-discharge the output node.

11 Claims, 4 Drawing Sheets

Related U.S. Application Data

(60) Provisional application No. 63/324,205, filed on Mar. 28, 2022.

(51) Int. Cl.
*H03K 19/20* (2006.01)
*H10D 84/85* (2025.01)

(58) Field of Classification Search
CPC .......... H03K 17/6874; H03K 19/0008; H03K 19/0013; H03K 19/01; H03K 19/017; H03K 19/01721; H03K 19/20; H04L 25/0264; H10D 84/859
See application file for complete search history.

(56) References Cited

U.S. PATENT DOCUMENTS

| | | | | |
|---|---|---|---|---|
| 5,644,255 | A | 7/1997 | Taylor | |
| 8,178,905 | B2 * | 5/2012 | Toubou | H10D 84/85 257/E23.079 |
| 8,816,740 | B1 | 8/2014 | Seshita | |
| 2006/0076976 | A1 | 4/2006 | Kwean | |
| 2010/0187615 | A1 * | 7/2010 | Becker | G06F 30/39 257/369 |

OTHER PUBLICATIONS

Extended European Search Report dated Dec. 8, 2023, issued in application No. EP 23163228.2.

* cited by examiner

BUFFER CIRCUITS AND SEMICONDUCTOR STRUCTURES THEREOF

CROSS REFERENCE TO RELATED APPLICATIONS

This application is a Divisional of U.S. application Ser. No. 18/183,359, filed Mar. 14, 2023, which claims the benefit of U.S. Provisional Application No. 63/324,205, filed Mar. 28, 2022, the entirety of which is incorporated by reference herein.

BACKGROUND OF THE INVENTION

Field of the Invention

The invention relates to a buffer circuit, and more particularly to a high-speed buffer circuit.

Description of the Related Art

A buffer circuit is one of the most commonly used digital circuits in chip and processor design. A buffer operates to receive an input signal and output an output signal that keeps the characteristics carried by the input signal but has a better driving ability. In high-speed applications such as central processing units (CPUs), graphics processing units (GPUs), and accelerated processing units (APUs) the amount of signal delay is an important indicator for evaluating performance. Thus, buffer circuits that operate at high speeds are required to enhance the performance of high-speed applications.

BRIEF SUMMARY OF THE INVENTION

An exemplary embodiment of a buffer circuit may pre-charge or pre-discharge an output node in response to an input, so that an output signal generated at the output node may rapidly reach a voltage level in response to the input signal.

An exemplary embodiment of a buffer circuit is provided. The buffer circuit receives an input signal at an input node and outputs an output signal at an output node. The buffer circuit includes a first inverter, a second inverter, a first switch, and a second switch. The first inverter is coupled to the input node to receive the input signal. The first inverter inverts the input signal to generate an inverted input signal. The second inverter has an input terminal receiving the inverted input signal and an output terminal coupled to the output node. The first switch is coupled between a first voltage source terminal and the output node and controlled by the input signal. The second switch is coupled between the output node and a second voltage source terminal and controlled by the input signal. A first voltage is provided to the first voltage source terminal. A second voltage is provided to the second voltage source terminal. In response to the input signal switching to a first level from a second level, the first switch is turned on to pre-charge the output node toward the first voltage. In response to the input signal transiting to the second level from the first level, the second switch is turned on to pre-discharge the output node toward the second voltage.

An exemplary embodiment of a semiconductor structure of a buffer circuit is provided. The semiconductor structure comprises a substrate, a P-type diffusion region, a N-type diffusion region, a first polysilicon region, a first conductive segment, and a second conductive segment. The P-type diffusion region is formed on the substrate. The P-type diffusion region extends parallel to a first direction. The N-type diffusion region is formed on the substrate and spaced apart from the P-type diffusion region. The N-type diffusion region extends parallel to the first direction. The first polysilicon region is formed above the P-type and N-type diffusion regions. The first polysilicon region extends parallel to a second direction. The first direction is perpendicular to the second direction. The first conductive segment extends parallel to the first direction. The second conductive segment is spaced apart from the first conductive segment. The second conductive segment extends parallel to the first direction. The P-type diffusion region comprises a first P-type diffusion portion disposed on a first side of the first polysilicon region, and the first P-type diffusion portion is electrically connected to the second conductive segment. The N-type diffusion region comprises a first N-type diffusion portion disposed on the first side of the first poly region, and the first N-type diffusion portion is electrically connected to the first conductive segment.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
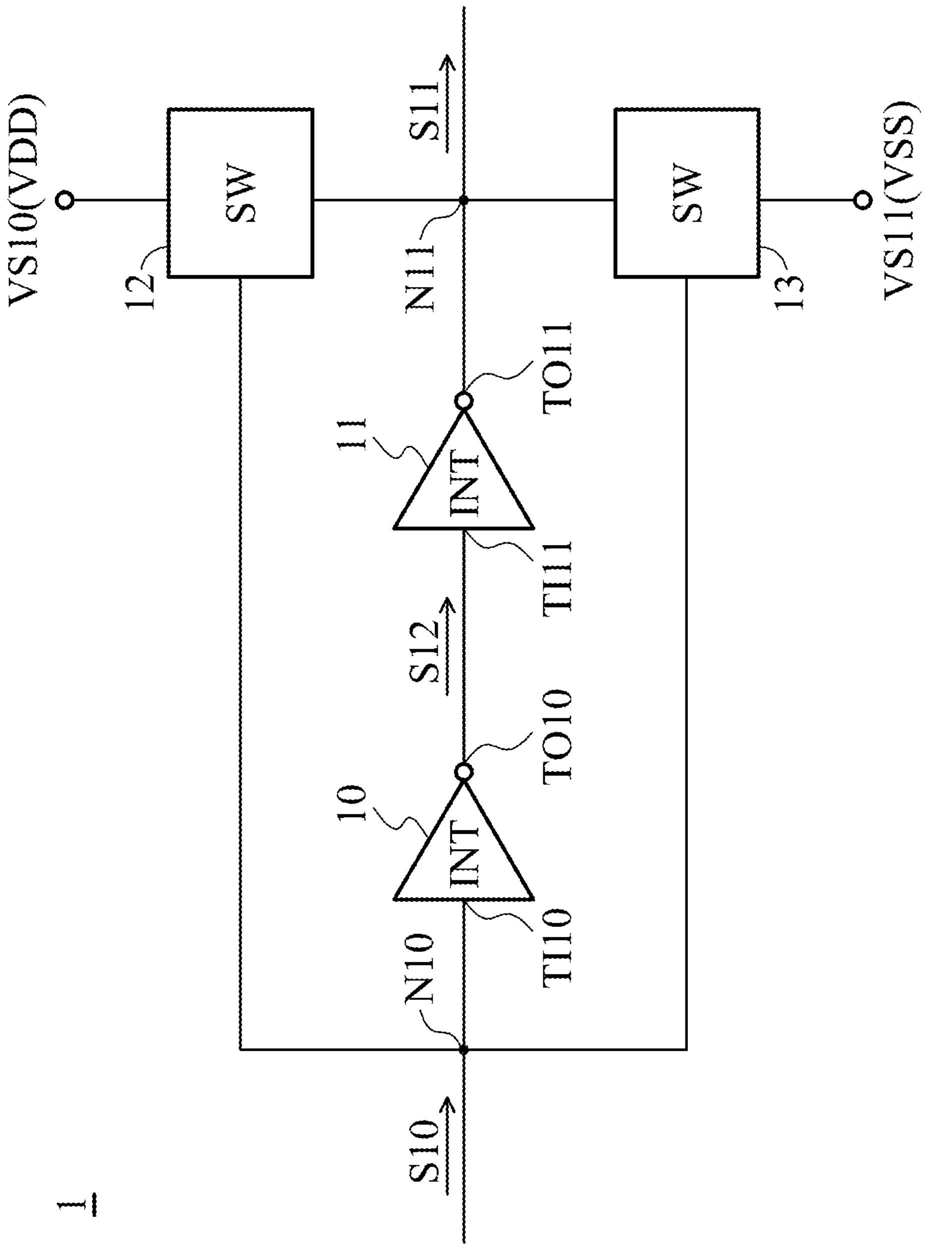
FIG. 1 shows one exemplary embodiment of a buffer circuit.

FIG. 1 shows an exemplary embodiment of a buffer circuit. As shown in FIG. 1, a buffer circuit 1 receives an input signal S10 at an input node N10 and generates an output signal S11 at an output node N11. The buffer circuit 1 receives a voltage VDD through a voltage source terminal VS10 and further receives a voltage VSS through a voltage source terminal VS11. In the embodiment, the voltage VDD is higher than the voltage VSS. For example, the voltage source terminal VS10 receives a positive voltage as the voltage VDD, while the voltage source terminal VS11 receives a negative voltage or a voltage of zero volts (0V) as the voltage VSS or is coupled to ground.

Referring to FIG. 1, the buffer circuit 1 comprises inverters (INTs) 10 and 11 and switches (SWs) 12 and 13. The inventor 10 has an input terminal TI10 and an output terminal TO10. The inventor 11 has an input terminal TI11 and an output terminal TO11. The input terminal TI10 is coupled to the input node N10 of the buffer circuit 1 for receiving the input signal S10. The input terminal TI11 is coupled to the output terminal TO10. The output terminal TO11 is coupled to the output node N11 of the buffer circuit 1.

The switch 12 is coupled between the voltage source terminal VS10 and the output node N11 and further coupled to the input node N10 to receive the input signal S10. The switch 12 is controlled by the input signal S10, in detail, the turned-on/off state of the switch 12 is determined according to the input signal S10. The switch 13 is coupled between the output node N11 and the voltage source terminal VS10 and further coupled to the input node N10 to receive the input signal S10. The switch 13 is controlled by the input signal S10, in detail, the turned-on/off state of the switch 13 is determined according to the input signal S10.

In the following paragraphs, the high-speed operation of the buffer circuit 1 is described.

Based on the operation of the buffer circuit 1, the output signal S11 generated at the output node N11 keeps the characteristics carried by the input signal S10, such as the phase, polarity, and/or voltage level of the input signal S10. For example, when the input signal S10 is at a relative high voltage level, the output signal S11 is at a relative high voltage level; when the input signal S10 is at a relative low voltage level, the output signal S11 is at a relative low voltage level. Accordingly, the output signal S11 varies with the input signal S10.

The inverter 10 receives the input signal S10 through the input terminal TI10. In cases in which the input signal S10 switches to the relative high voltage level from the relative low voltage level, the inverter 10 receives the input signal S10 having the relative high voltage level and then inverts the input signal S10 to generate an inverted input signal S12 having a relative low voltage level at the output terminal TO10. The switches 12 and 13 also receive the input signal S10. In the embodiment, according to the relative high voltage level of the input signal S10, the switch 12 is turned on while the switch 13 is turned off. At this time, the output node N11 is charged toward the voltage VDD through the turned-on switch 12. Since the switch 13 is turned off, a discharge path between the output node N11 and the voltage source terminal VS11 is cut off, so that the output node N11 can be charged toward the voltage VDD stably and continuously.

The inverter 11 receives the inverted input signal S12 having the relative low voltage level through the input terminal TI11 and then inverts the inverted input signal S12 to generate the output signal S11 at the output terminal TO11 that is coupled to the output node N11. As described above, since the output node N11 has been charged toward the voltage VDD, the voltage level of the output signal S11 can reach the relative high voltage level in a short time. In the embodiment, the relative high voltage level of the output signal S11 is equal to the level of the voltage VDD.

In cases in which the input signal S10 switches to the relative low voltage level from the relative high voltage level, the inverter 10 receives the input signal S10 having the relative low voltage level and then inverts the input signal S10 to generate the inverted input signal S12 having a relative high voltage level at the output terminal TO10. The switches 12 and 13 also receive the input signal S10. In the embodiment, according to the relative low voltage level of the input signal S10, the switch 12 is turned off while the switch 13 is turned on. At this time, the output node N11 is discharged toward the voltage VSS through the turned-on switch 13. Since the switch 12 is turned off, a charge path between the voltage source terminal VS10 and the output node N11 is cut off, so that the output node N11 can be discharged toward the voltage VSS stably and continuously.

The inverter 11 receives the inverted input signal S12 having the relative high voltage level through the input terminal TI11 and then inverts the inverted input signal S12 to generate the output signal S11 at the output terminal TO11 that is coupled to the output node N11. As described above, since the output node N11 has been discharged toward the voltage VSS, the voltage level of the output signal S11 can reach the relative low voltage level in a short time. In the embodiment, the relative low voltage level of the output signal S11 is equal to the level of the voltage VSS.

According to the embodiment of FIG. 1, when the input signal S10 switches between the relative high voltage level and the relative low voltage level, the output node N11 is pre-charged through the turned-on switch 12 or pre-discharged through the turned-on switch 13. Accordingly, in response to the switching of the voltage level of the input signal S10, the output signal S11 generated at the output node N11 may rapidly reach a predetermined voltage level corresponding to the voltage level of the input signal S10.

For a convention buffer circuit comprising two inverter stages coupled in series without the switches 12 and 13 proposed by the present embodiment, if there is a heavy load coupled to the output terminal of the buffer circuit, the output signal generated by the buffer circuit may take a long time to reach a predetermined voltage level in response to the input signal of the buffer circuit, which increases the delay between the output signal and the input signal. The increases delay causes low performance of the circuitry using the buffer circuit.

On the contrary, the buffer circuit 1 provided by the embodiment can pre-charge or pre-discharge the output signal S11 in response to the voltage level of the input signal S10. Therefore, even if a heavy load is coupled to the output node N11 of the buffer circuit 1, the output signal S11 can still rapidly reach a predetermined voltage level in response to the switching of the voltage level of the input signal S10, thereby achieving the high-speed operation of the buffer circuit.

Figure 2:
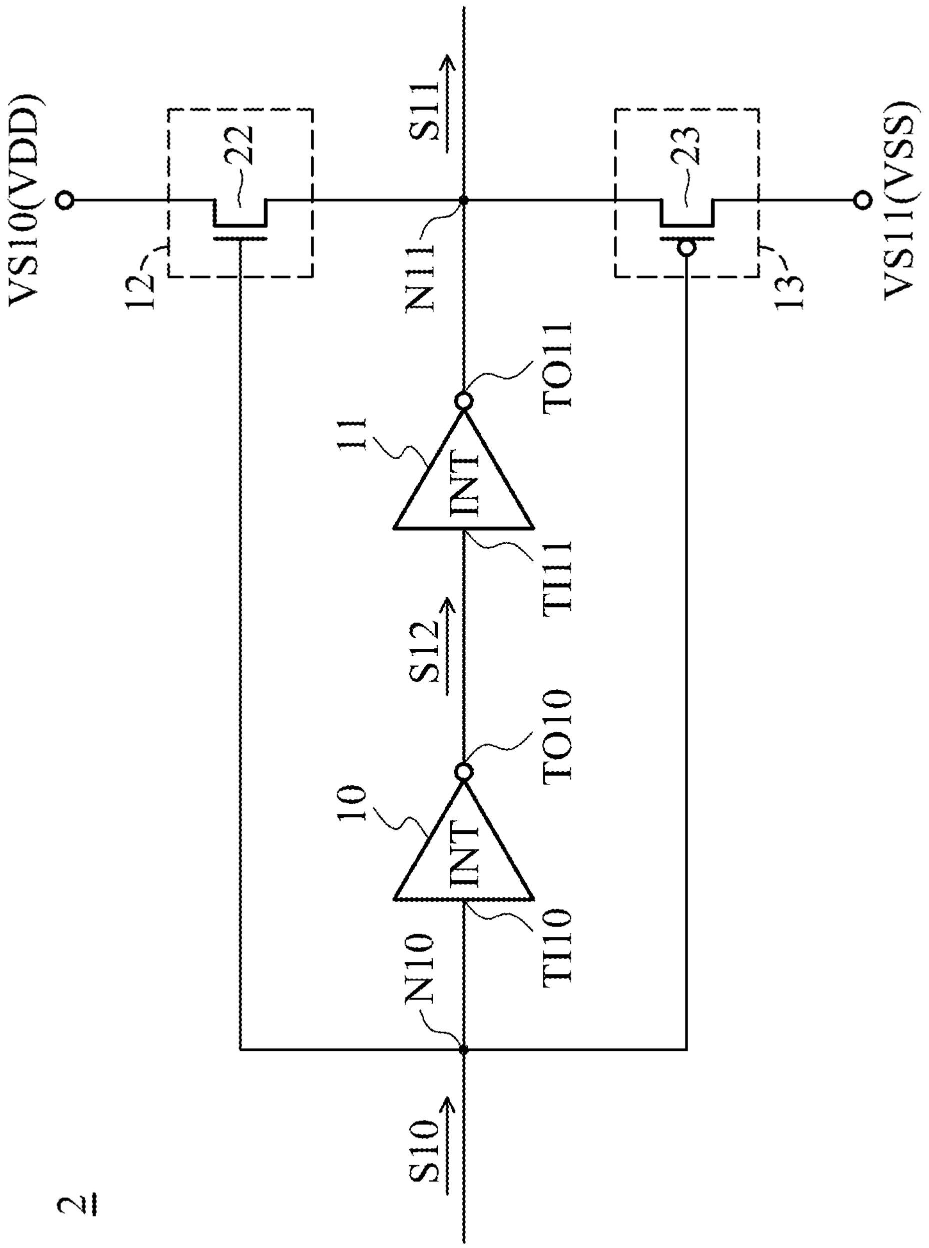
FIG. 2 shows another exemplary embodiment of a buffer circuit.

FIG. 2 shows another exemplary embodiment of a buffer circuit. Referring to FIG. 2, another buffer circuit 2 is provided. The structure of the buffer circuit 2 is similar to the structure of the buffer circuit 1 of FIG. 1, and the same elements in the buffer circuits 1 and 2 are represented by the same reference signs. Thus, the description related to the connections and operations of the same elements of the buffer circuits 1 and 2 is omitted here.

The difference between the buffer circuit 2 of FIG. 2 and the buffer circuit 1 of FIG. 1 is the implement of the switches 12 and 13. Referring to FIG. 2, the switch 12 comprises an N-type transistor 22, and the switch 13 comprises a P-type transistor 23. In the embodiment, the N-type transistor 22 and the P-type transistor 23 are implemented by metal-oxide-semiconductor (MOS) transistors. The gate electrode of the N-type transistor 22 is coupled to the input node N10 to receive the input signal S10, and the first and second drain/source electrodes thereof are coupled to the voltage source terminal VS10 and the output node N11 respectively. The N-type transistor 22 is controlled by the input signal S10, in detail, the turned-on/off state of the N-type transistor 22 is determined according to the input signal S10. The gate electrode of the P-type transistor 23 is coupled to the input node N10 to receive the input signal S10, and the first drain/source electrode and the second drain/source electrode thereof are coupled to the output node N11 and the voltage source terminal VS11 respectively. The P-type transistor 23 is controlled by the input signal S10, in detail, the turned-on/off state of the P-type transistor 23 is determined according to the input signal S10.

In cases in which the input signal S10 switches to the relative high voltage level from the relative low voltage level, according to the relative high voltage level of the input signal S10, the N-type transistor 22 is turned on while the P-type transistor 23 is turned off. At this time, the output node N11 is charged toward the voltage VDD through the turned-on N-type transistor 22. Since the P-type transistor 23 is turned off, a discharge path between the output node N11 and the voltage source terminal VS11 is cut off, so that the output node N11 can be charged toward the voltage VDD stably and continuously.

In cases in which the input signal S10 switches to the relative low voltage level from the relative high voltage level, according to the relative low voltage level of the input signal S10, the N-type transistor 22 is turned off while the P-type transistor 23 is turned on. At this time, the output node N11 is discharged toward the voltage VSS through the turned-on P-type transistor 23. Since the N-type transistor 22 is turned off, a charge path between the voltage source terminal VS10 and the output node N11 is cut off, so that the output node N11 can be discharged toward the voltage VSS stably and continuously.

According to the embodiment of FIG. 2, when the input signal S10 switches between the relative high voltage level and the relative low voltage level, the output node N11 is pre-charged through the N-type transistor 22 or pre-discharged through the turned-on P-type transistor 23. Accordingly, in response to the switching of the voltage level of the input signal S10, the output signal S11 generated at the output node N11 may rapidly reach a predetermined voltage level corresponding to the voltage level of the input signal S10.

Figure 3:
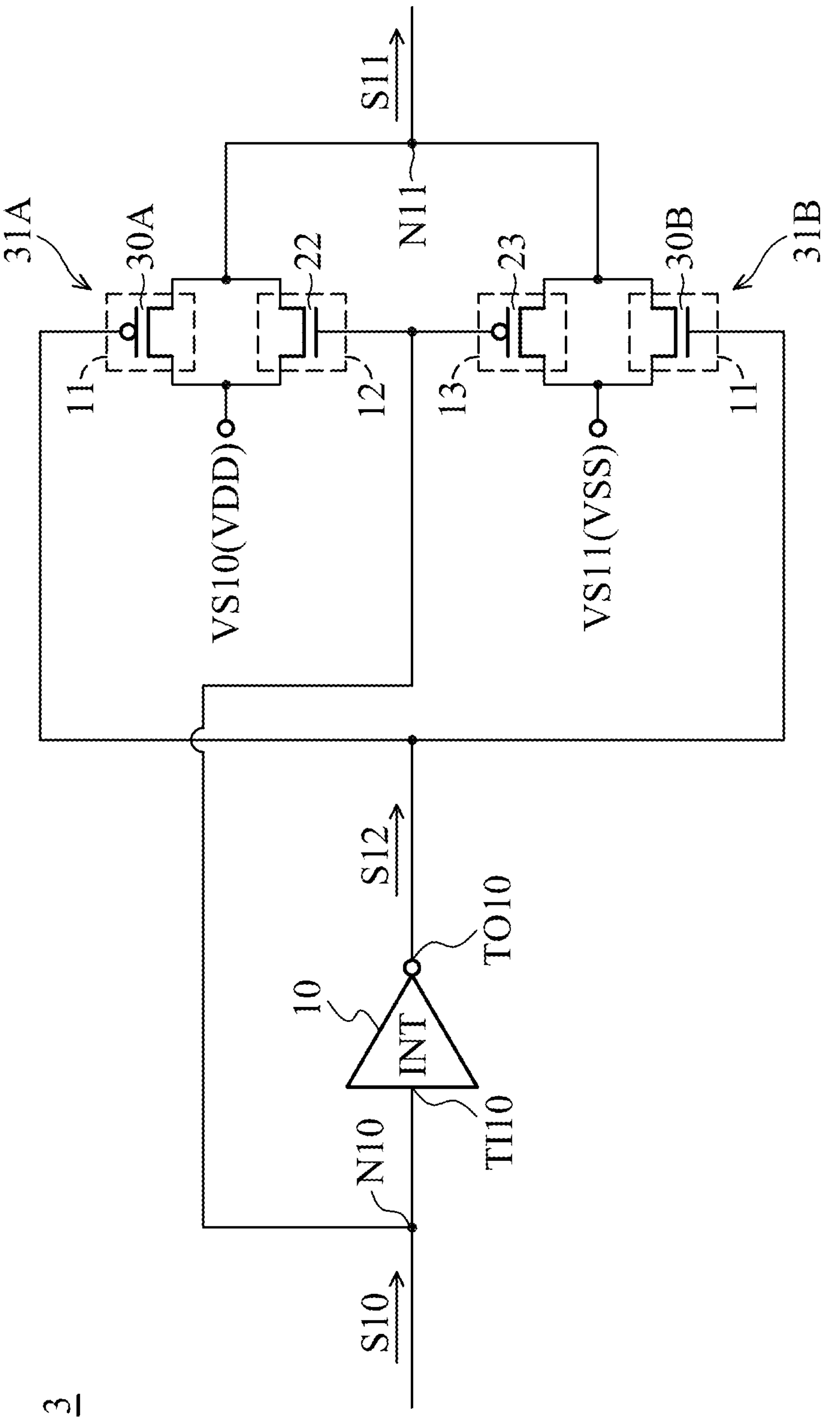
FIG. 3 shows another exemplary embodiment of a buffer.

FIG. 3 shows another exemplary embodiment of a buffer circuit. Referring to FIG. 3, another buffer circuit 3 is provided. The structure of the buffer circuit 3 is similar to the structure of the buffer circuit 2 of FIG. 2, and the same elements in the buffer circuits 2 and 3 are represented by the same reference signs. Thus, the description related to the connections and operations of the same elements of the buffer circuits 2 and 3 is omitted here.

The difference between the buffer circuit 3 of FIG. 3 and the buffer circuit 2 of FIG. 2 is the implement of the inverter 11. Referring to FIG. 3, the inverter 11 comprises an N-type transistor 30B and a P-type transistor 30A. In the embodiment, the N-type transistor 30B and the P-type transistor 30A are implemented by metal-oxide-semiconductor (MOS) transistors. The gate electrode of the P-type transistor 30A is coupled to the output terminal TO10 of the inverter 10 to receive the inverted input signal S12, and the first and second drain/source electrodes thereof are coupled to the voltage source terminal VS10 and the output node N11 respectively. As shown in FIG. 3, the gate electrode of the N-type transistor 22 receives the input signal S10 that is inverse to the inverted input signal S12, and the first and second drain/source electrodes thereof are coupled to the voltage source terminal VS10 and the output node N11 respectively. Thus, the N-type transistor 22 and the P-type transistor 30A form a transmission gate 31A.

The gate electrode of the N-type transistor 30B is coupled to the output terminal TO10 of the inverter 10 to receive the inverted input signal S12, and the first and second drain/source electrodes thereof are coupled to the output node N11 and the voltage source terminal VS11 respectively. As shown in FIG. 3, the gate electrode of the P-type transistor 23 receives the input signal S10 that is inverse to the inverted input signal S12, and the first and second drain/source electrodes thereof are coupled to the output node N11 and the voltage source terminal VS11 respectively. Thus, the P-type transistor 23 and the N-type transistor 30B form a transmission gate 31B.

In cases in which the input signal S10 switches to the relative high voltage level from the relative low voltage level, the P-type transistor 30A is turned on according to the inverted input signal S12 having the relative low voltage level. At the same time, the N-type transistor 22 is also turned on according to the input signal S10 having the relative high voltage level. Moreover, the transistors 23 and 30B are turned off. Due to the turned-on states of the transistors 12 and 30A, the transmission gate 31A passes the voltage VDD to the output node N11, thereby charging the output node N11 toward the voltage VDD.

In cases in which the input signal S10 switches to the relative low voltage level from the relative high voltage level, the N-type transistor 30B is turned on according to the inverted input signal S12 having the relative high voltage level. At the same time, the P-type transistor 23 is also turned on according to the input signal S10 having the relative low voltage level. Moreover, the transistors 22 and 30A are turned off. Due to the turned-on states of the transistors 13 and 30B, the transmission gate 31B passes the voltage VSS to the output node N11, thereby discharging the output node N11 toward the voltage VSS.

According to the embodiment of FIG. 3, when the input signal S10 switches between the relative high voltage level and the relative low voltage level, the output node N11 is pre-charged through the transmission gate 31A or pre-discharged through the transmission gate 31B. Based on characteristics of a transmission gate, an input signal of the transmission gate can be fully transmitted to the output of the transmission gate without voltage drop. Accordingly, in response to the switching of the voltage level of the input signal S10, the output signal S11 generated at the output node N11 may rapidly reach a predetermined voltage level corresponding to the voltage level of the input signal S10 and further fully swing according to the voltages VDD and VSS.

According to the embodiment of FIG. 3, the transmission gates 31A and 31B receive the input signal S10 and the inverted input signal S12 to selectively output one of the voltage VDD or the voltage VSS to the output node N11 according to the input signal S10 and the inverted input signal S12. Thus, the circuit composed of the transmission gates 31A and 31B operates as a multiplexer that receives the voltage VDD and the voltage VSS and is controlled by the input signal S10 and the inverted input signal S12 to selectively output the voltage VDD or the voltage VSS to the output node N11.

Figure 4:
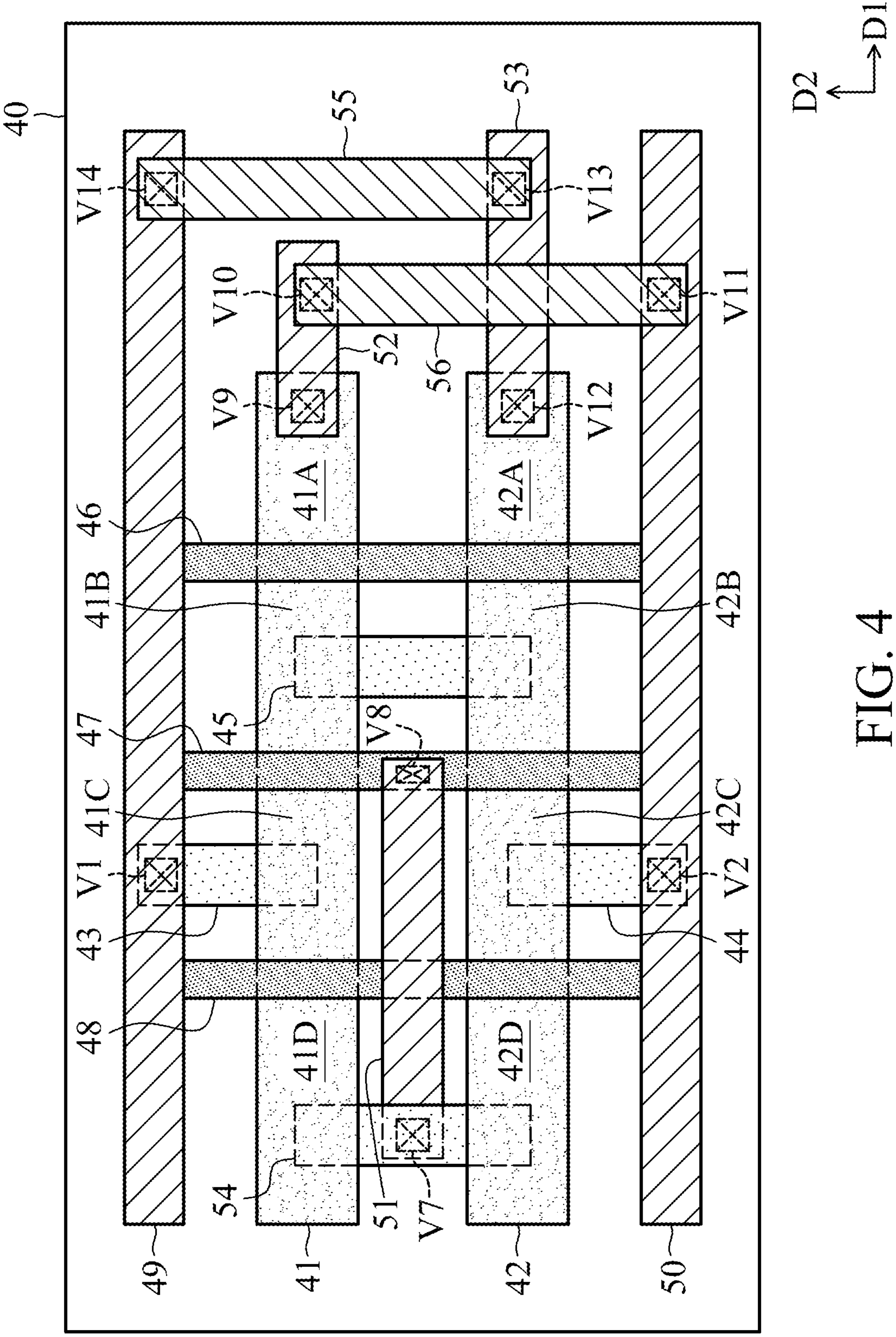
FIG. 4 shows an exemplary embodiment of a layout of a buffer circuit.

FIG. 4 shows an exemplary embodiment of a layout of a buffer circuit. In the embodiment of FIG. 4, the layout is for forming the buffer circuit 3. Referring to FIG. 4, the buffer circuit 3 is formed on a substrate 40. A P-type diffusion region 41 and an N-type diffusion region 42 are formed on the substrate 40 and further extend parallel to a direction D1. As shown in FIG. 4, the P-type diffusion region 41 is spaced apart from the N-type diffusion region 42. Three polysilicon regions 46-48 are formed above the P-type diffusion region 41 and the N-type diffusion region 42 and further extend parallel to a direction D2 and across the P-type diffusion region 41 and the N-type diffusion region 42. As indicated in FIG. 4, the direction D1 is perpendicular to the direction D2. The polysilicon region 47 is disposed between the polysilicon regions 46 and 48. The P-type diffusion region 41 is divided into four P-type diffusion portions 41A-41D by the polysilicon regions 46-48. The P-type diffusion portions 41A is disposed on the right side of the polysilicon region 46. The P-type diffusion portions 41B is disposed on the left side of the polysilicon region 46 and between the polysilicon regions 46 and 47. The P-type diffusion portions 41C is disposed on the right side of the polysilicon region 48 and between the polysilicon regions 47 and 48. The P-type diffusion portions 41D is disposed on the left side of the polysilicon region 48.

The N-type diffusion region 42 is also divided into four N-type diffusion portions 42A-42D by the polysilicon regions 46-48. The N-type diffusion portions 42A is disposed on the right side of the polysilicon region 46. The N-type diffusion portions 42B is disposed on the left side of the polysilicon region 46 and between the polysilicon regions 46 and 47. The N-type diffusion portions 42C is disposed on the right side of the polysilicon region 48 and between the polysilicon regions 47 and 48. The N-type diffusion portions 42D is disposed on the left side of the polysilicon region 48.

Two conductive segments 49 and 50 are formed above the P-type diffusion region 41 and the N-type diffusion region 42 and extend parallel to the direction D1. The conductive segments 49 and 50 are spaced apart from each other. Particularly, the P-type diffusion region 41 and the N-type diffusion region 42 are disposed between the conductive segments 49 and 50. The P-type diffusion region 41 is closed to the conductive segment 49, and the N-type diffusion region 42 is closed to the conductive segment 50.

A conductive segment 43 is formed under the P-type diffusion region 41 and the conductive segment 49 and extends parallel to the direction D2. A first end of the conductive segment 43 is electrically connected to the conductive segment 49 through a via V1, and a second end thereof is electrically connected to the P-type diffusion portion 41C. A conductive segment 44 is formed under the N-type diffusion region 42 and the conductive segment 50 and extends parallel to the direction D2. A first end of the conductive segment 44 is electrically connected to the conductive segment 50 through a via V2, and a second end thereof is electrically connected to the N-type diffusion portion 42C.

Referring to FIG. 4, a conductive segment 45 formed under the P-type diffusion region 41 and the N-type diffusion region 42 and extends parallel to the direction D2. A first end of the conductive segment 45 is electrically connected to the P-type diffusion portion 41B, and a second end thereof is electrically connected to the N-type diffusion portion 42B. In other words, the conductive segment 45 electrically connects the P-type diffusion portion 41B to the N-type diffusion portion 42B.

A conductive segment 54 is formed under the P-type diffusion region 41 and the N-type diffusion region 42 and extends parallel to the direction D2. A conductive segment 51 is formed above the conductive segment 54 and the polysilicon regions 47 and 48 and extends parallel to the direction D1. The conductive segment 51 is disposed between the P-type diffusion region 41 and the N-type diffusion region 42. A first end of the conductive segment 54 is electrically connected to the P-type diffusion portion 41D, and a second end thereof is electrically connected to the N-type diffusion portion 42D. In other words, the conductive segment 54 electrically connects the P-type diffusion portion 41D to the N-type diffusion portion 42D. A first end of the conductive segment 51 is electrically connected to the conductive segment 54 through a via V7, and a second end thereof is electrically connected to the polysilicon region 47 through a via V8. In other words, the conductive segment 51 electrically connects the conductive segment 54 to the polysilicon region 47. Therefore, the P-type diffusion portion 41D, the N-type diffusion portion 42D, and the polysilicon region 47 are electrically connected together.

A conductive segment 52 is formed above the P-type diffusion region 41 and extends parallel to the direction D1. A conductive segment 56 is formed above the conductive segment 52 and extends parallel to the direction D2. A first end of the conductive segment 52 is electrically connected to the P-type diffusion portion 41A through a via V9. A first end of the conductive segment 56 is electrically connected to a second end of the conductive segment 52 through a via V10, and a second end thereof is electrically connected to the conductive segment 50 through a via V11.

A conductive segment 53 is formed above the N-type diffusion region 42 and extends parallel to the direction D1. A conductive segment 55 is formed above the conductive segment 53 and extends parallel to the direction D2. A first end of the conductive segment 53 is electrically connected to the N-type diffusion portion 42A through a via V12. A first end of the conductive segment 55 is electrically connected to a second end of the conductive segment 53 through a via V13, and a second end thereof is electrically connected to the conductive segment 49 through a via V14.

According to the above description, two regions are electrically connected through a via. For example, the conductive segment 43 is electrically connected to the conductive segment 49 through the via V1. However, in other embodiments, two regions may be electrically connected in another connection manner that depends upon the applied manufacturing process.

In the embodiment, the conductive segments 49-53 are formed on the same metal layer (Metal 0) that is close to the P-type diffusion region 41 and the N-type diffusion region 42. The conductive segments 55 and 56 are formed on the same metal layer (Metal 1) that is formed above the metal layer (Metal 0). The conductive segments 43-45 and 54 are formed on the same metal layer (Metal D) under the diffusion regions 41 and 42.

Referring to FIGS. 3 and 4, the polysilicon region 48, the P-type diffusion portions 41C-41D, and the N-type diffusion portions 42C-42D form a complementary metal-oxide-semiconductor (CMOS) structure to serve as the inverter 10. The polysilicon region 48 is electrically connected to the input node N10. The input signal S10 from the input node N10 is applied to the polysilicon region 48, and the inverted input signal S12 is generated on the conductive segment 54. The inverted input signal S12 is applied to the polysilicon region 47 through the conductive segment 51.

The polysilicon region 47 and the P-type diffusion portions 41B-41C form the P-type transistor 30A of the inverter 11, and the polysilicon region 47 and the N-type diffusion portions 42B-42C form the N-type transistor 30B of the inverter 11. The polysilicon region 47, the P-type diffusion portion 41C, and the P-type diffusion portion 41B serve as the gate electrode, the first drain/source electrode, and the second drain/source electrode of the P-type transistor 30A. The polysilicon region 47, the N-type diffusion portion 42B, and the N-type diffusion portion 42C serve as the gate electrode, the first drain/source electrode, and the second drain/source electrode of the N-type transistor 30B.

The polysilicon region 46 and the P-type diffusion portions 41A-41B form the P-type transistor 23, and the polysilicon region 46 and the N-type diffusion portions 42A-42B form the N-type transistor 22. The polysilicon region 46, the P-type diffusion portion 41B, and the P-type diffusion portion 41A serve as the gate electrode, the first drain/source electrode, and the second drain/source electrode of the P-type transistor 23. The polysilicon region 46, the N-type diffusion portion 42A, and the N-type diffusion portion 42B serve as the gate electrode, the first drain/source electrode, and the second drain/source electrode of the N-type transistor 22.

The polysilicon region 46 is electrically connected to the input node N10. The input signal S10 from the input node N10 is applied to the polysilicon region 46. The conductive segments 49 is electrically connected to the voltage source terminal VS10 of the buffer circuit 3, and the conductive segments 50 is electrically connected to the voltage source terminal VS11 of the buffer circuit 3. The conductive segment 45 is electrically connected to the output node N11 of the buffer circuit 3.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure of a buffer circuit, comprising:

a substrate;

a P-type diffusion region formed on the substrate and extending parallel to a first direction;

an N-type diffusion region formed on the substrate, spaced apart from the P-type diffusion region, and extending parallel to the first direction;

a first polysilicon region formed above the P-type and N-type diffusion regions and extending parallel to a second direction and across the P-type and N-type diffusion regions, wherein the first direction is perpendicular to the second direction;

a first conductive segment extending parallel to the first direction; and a second conductive segment spaced apart from the first conductive segment and extending parallel to the first direction, wherein the P-type diffusion region comprises a first P-type diffusion portion disposed on a first side of the first polysilicon region, and the first P-type diffusion portion is electrically connected to the second conductive segment, wherein the N-type diffusion region comprises a first N-type diffusion portion disposed on the first side of the first poly region, and the first N-type diffusion portion is electrically connected to the first conductive segment, and wherein a first voltage provided to the first conductive segment is higher than a second voltage provided to the second conductive segment.

2. The semiconductor structure as claimed in claim 1, further comprising:

a third conductive segment formed above the P-type diffusion region and extending parallel to the first direction; and a fourth conductive segment formed above the third conductive segment and extending parallel to the second direction, wherein the third conductive segment comprises a first end electrically connected to the first P-type diffusion portion and a second end, and wherein the fourth conductive segment comprises a first end electrically connected to the second end of the third conductive segment and a second end electrically connected to the second conductive segment.

3. The semiconductor structure as claimed in claim 1, further comprising:

a third conductive segment formed above the N-type diffusion region and extending parallel to the first direction; and a fourth conductive segment formed above the third conductive segment and extending parallel to the second direction, wherein the third conductive segment comprises a first end electrically connected to the first N-type diffusion portion and a second end, and wherein the fourth conductive segment comprises a first end electrically connected to the second end of the third conductive segment and a second end electrically connected to the first conductive segment.

4. The semiconductor structure as claimed in claim 1, further comprising:

a second polysilicon region formed above the first and second diffusion regions and extending parallel to the second direction and across the P-type and N-type diffusion regions; and a third polysilicon region formed above the first and second diffusion regions and extending parallel to the second direction and across the P-type and N-type diffusion regions, wherein the third polysilicon region is disposed between the first and second polysilicon regions, wherein the P-type diffusion region comprises a second P-type diffusion portion disposed between the second and third polysilicon regions, and the second P-type diffusion portion is electrically connected to the first conductive segment, and wherein the N-type diffusion region comprises a second N-type diffusion portion disposed between the second and third polysilicon regions, and the second N-type diffusion portion is electrically connected to the second conductive segment.

5. The semiconductor structure as claimed in claim 4, further comprising:

a third conductive segment formed under the P-type diffusion region and the first conductive segment and extending parallel to the second direction; and a fourth conductive segment formed under the N-type diffusion region and the second conductive segment and extending parallel to the second direction, wherein the third conductive segment electrically connects the first conductive segment to the second P-type diffusion portion, and the fourth conductive segment electrically connects the second conductive segment to the second N-type diffusion portion.

6. The semiconductor structure as claimed in claim 4, wherein:

an input signal of the buffer circuit is applied to the first polysilicon region and the second polysilicon region, and a signal that is inverse to the input signal is applied to the third polysilicon region.

7. The semiconductor structure as claimed in claim 4, wherein:

the P-type diffusion region comprises a third P-type diffusion portion disposed between the first and third polysilicon regions, the N-type diffusion region comprises a third N-type diffusion portion disposed between the first and third polysilicon regions, and the third P-type diffusion portion is electrically connected to the third N-type diffusion portion.

8. The semiconductor structure as claimed in claim 7, further comprising:

a third conductive segment formed under the P-type diffusion region and the N-type diffusion region and extending parallel to the second direction;

wherein the third conductive segment electrically connects the third P-type diffusion portion to the third N-type diffusion portion, and wherein the third conductive segment is electrically connected to an output node of the buffer circuit.

9. The semiconductor structure as claimed in claim 4, wherein:

the P-type diffusion region comprises a third P-type diffusion portion, and the second and third P-type diffusion portions are disposed on two sides of the second polysilicon region respectively, the N-type diffusion region comprises a third N-type diffusion portion, and the second and third N-type diffusion portions are disposed on two sides of the second polysilicon region respectively, and the third P-type diffusion portion is electrically connected to the third N-type diffusion portion and the third polysilicon region.

10. The semiconductor structure as claimed in claim 9, further comprising:

a third conductive segment formed under the P-type diffusion region and the N-type diffusion region and extending parallel to the second direction; and a fourth conductive segment formed above the third conductive segment and extending parallel to the first direction, wherein the third conductive segment electrically connects the third P-type diffusion portion to the third N-type diffusion portion, and wherein the fourth conductive segment electrically connects the third conductive segment to the third polysilicon region.

11. The semiconductor structure as claimed in claim 1, wherein an input signal of the buffer circuit is applied to the first polysilicon region.

* * * * *